(12) United States Patent
Ring

(10) Patent No.: US 6,949,975 B2
(45) Date of Patent: Sep. 27, 2005

(54) DISTORTION DETECTION FOR A POWER AMPLIFIER

(75) Inventor: Steven R. Ring, Bristol (GB)

(73) Assignee: Andrew Corporation, Orland Park, IL (US)

(*) Notice: Subject to any disclaimer, the term of this patent is extended or adjusted under 35 U.S.C. 154(b) by 265 days.

(21) Appl. No.: 10/204,235

(22) PCT Filed: Jan. 29, 2001

(86) PCT No.: PCT/GB01/00360

§ 371 (c)(1),
(2), (4) Date: Dec. 4, 2002

(87) PCT Pub. No.: WO01/61841

PCT Pub. Date: Aug. 23, 2001

(65) Prior Publication Data

US 2004/0021514 A1 Feb. 5, 2004

(30) Foreign Application Priority Data

Feb. 14, 2000 (GB) .............................. 0003666

(51) Int. Cl.[7] .............................................. H03F 1/26
(52) U.S. Cl. ...................................... 330/149; 330/136
(58) Field of Search ............................... 330/149, 151, 330/136; 375/297

(56) References Cited

U.S. PATENT DOCUMENTS 4,412,185 A   10/1983   Gerard
5,594,385 A   1/1997    Anvari
6,246,286 B1 * 6/2001   Persson ...................... 330/149
6,384,681 B1 * 5/2002   Bonds ......................... 330/149

FOREIGN PATENT DOCUMENTS

| EP | 1 067 676 A  | 1/2001 |
| FR | 2 532 491    | 3/1984 |
| WO | WO 97/28598  | 8/1997 |

* cited by examiner

*Primary Examiner*—Henry Choe
(74) *Attorney, Agent, or Firm*—Steve Mendelsohn

(57) ABSTRACT

The input and output of amplifier (110) are sampled and downconverted in frequency and filtered at (124 and 126) to produce sub-band signals. The input signal sub-band (134) is then subtracted from the output signal sub-band (136) at (130) to produce a residual signal (132) containing any distortion present in the sub-band selected by the downconversion oscillator (128). Signal analyser (158) compares the input and output signal energy to deduce the amount of distortion in the output signal, to provide signals for controlling a distortion reduction mechanism such as a predistorter operating on amplifier (110). Alternatively, the input signal sub-band (134) and the output signal sub-band (136) are Fourier transformed (210 and 212) to produce spectrums which can be analysed to determine the presence of distortion in the output of amplifier (110).

26 Claims, 2 Drawing Sheets

DISTORTION DETECTION FOR A POWER AMPLIFIER

BACKGROUND OF THE INVENTION

1. Field of the Invention

This invention relates to methods and apparatus for detecting distortion in an output signal which a signal handling means (such as an amplifier) produces in response to an input signal.

2. Description of the Related Art

It is known to use distortion reduction mechanisms on amplifiers in an attempt to linearise the amplifier's response. It is often desirable to monitor residual distortion in the output of the amplifier, and to use this signal to adapt the distortion reduction mechanism to maximise the cancellation of the distortion. It is known to use a pilot signal to detect residual distortion. The pilot signal is added to the input signal and detected in the output signal so that any distortion it experiences can be assessed. The use of pilot signals for distortion detection has the disadvantage that a pilot signal must be generated, detected and then removed from the output signal afterwards. Thus, the use of pilot signals increases system complexity and adds the risk that spurious noise or continuous wave (CW) emissions introduced by the pilot signal detection system will remain as unwanted residues in the amplifier output.

SUMMARY OF THE INVENTION

An object of the invention is to provide the detection of distortion without the use of pilot signals and ameliorate at least some of the problems identified above.

According to one aspect, the invention provides a method of detecting distortion in an output signal which a signal handling means produces in response to an input signal, the method comprising isolating as a first signal a frequency range of the input signal and in parallel and as a second signal a frequency range of the output signal, and comparing the first and second signals to assess the output signal for phase distortion.

According to another aspect, the invention provides apparatus for detecting distortion in an output signal which a signal handling means produces in response to an input signal, the apparatus comprising means for isolating as a first signal a frequency range of the input signal and in parallel and as a second signal a frequency range of the output signal, and comparing means for comparing the first and second signals to assess the output signal for phase distortion.

By comparing the input and output signals in this way, the presence of phase distortion in the output signal can be assessed, and a pilot signal is not used.

In the preferred embodiment, the frequency ranges are substantially the same, and the isolating step may involve frequency converting the input and output signal to produce the first and second signals. Preferably, the frequency conversion is frequency down-conversion which means that the resulting signals are of lower frequency and therefore provide less demands on the devices used to handle them. Advantageously, the same signal can be used to frequency down-convert both the input and output signals.

The isolating step may be performed at a series of different frequency ranges. The series may be such that at least two adjacent ranges overlap or abut one another. Alternatively, it can be arranged that at least two of the ranges are discontinuous, so that complete frequency coverage is not provided. In one embodiment, the isolating step traverses the series of ranges in a sequence which is not in frequency order. This may help to avoid interactions between the temporal characteristics of the input signal and the isolating step sequence.

Frequency ranges used in the isolation step may be fixed or chosen to cover a frequency range of interest (for example, to target an active part of the frequency band of the input signal). In a preferred embodiment, at least one frequency range used in the isolation step can be chosen dynamically.

Advantageously, the comparing step comprises subtracting the fist signal from the second signal to produce a residual signal. The residual signal may contain substantially only residual distortion that has been caused by the signal handling means. The signals involved in the subtraction may need to be scaled relative to one another so that the wanted signals (i.e. those which are ideally to be obtained from the signal handling means) cancel leaving only the distortion which it is desired to detect. Such scaling of the signals may be needed where the signal handling means amplifies the input signal.

The comparison step may involve the correlation of the residual signal with a reference distortion signal to produce a signal indicative of distortion in the residual signal corresponding to the reference distortion signal. Preferably, the reference distortion signal is derived from the first signal (which is part of the input signal). The reference distortion signal may be derived by multiplying the first signal with itself repeatedly.

The comparison step may involve transforming the residual signal to the frequency domain for further analysis. In this way, the spectrum of the residual distortion can be analysed. Preferably, the first signal is also transformed to the frequency domain (e.g. by FFT), thus allowing comparisons to be made between the two spectra. For example, the spectrum of the first signal may be used to identify any remaining wanted signal components which have not been removed from the residual distortion signal or to provide a reference against which the magnitude of components in the residual distortion spectrum can be measured.

In a particularly preferred embodiment, the inventive method and apparatus for detecting distortion is used to control a distortion reduction mechanism operating on a distorting signal handling means. In this way, the distortion reduction mechanism may be adapted to maximise the cancellation of the distortion created by the signal handling means. For example, the distortion reduction mechanism could be a predistortion lineariser or a feed-forward lineariser.

By way of example only, certain embodiments of the invention will now be described with reference to the accompanying figures, in which:

DETAILED DESCRIPTION

Figure 1:
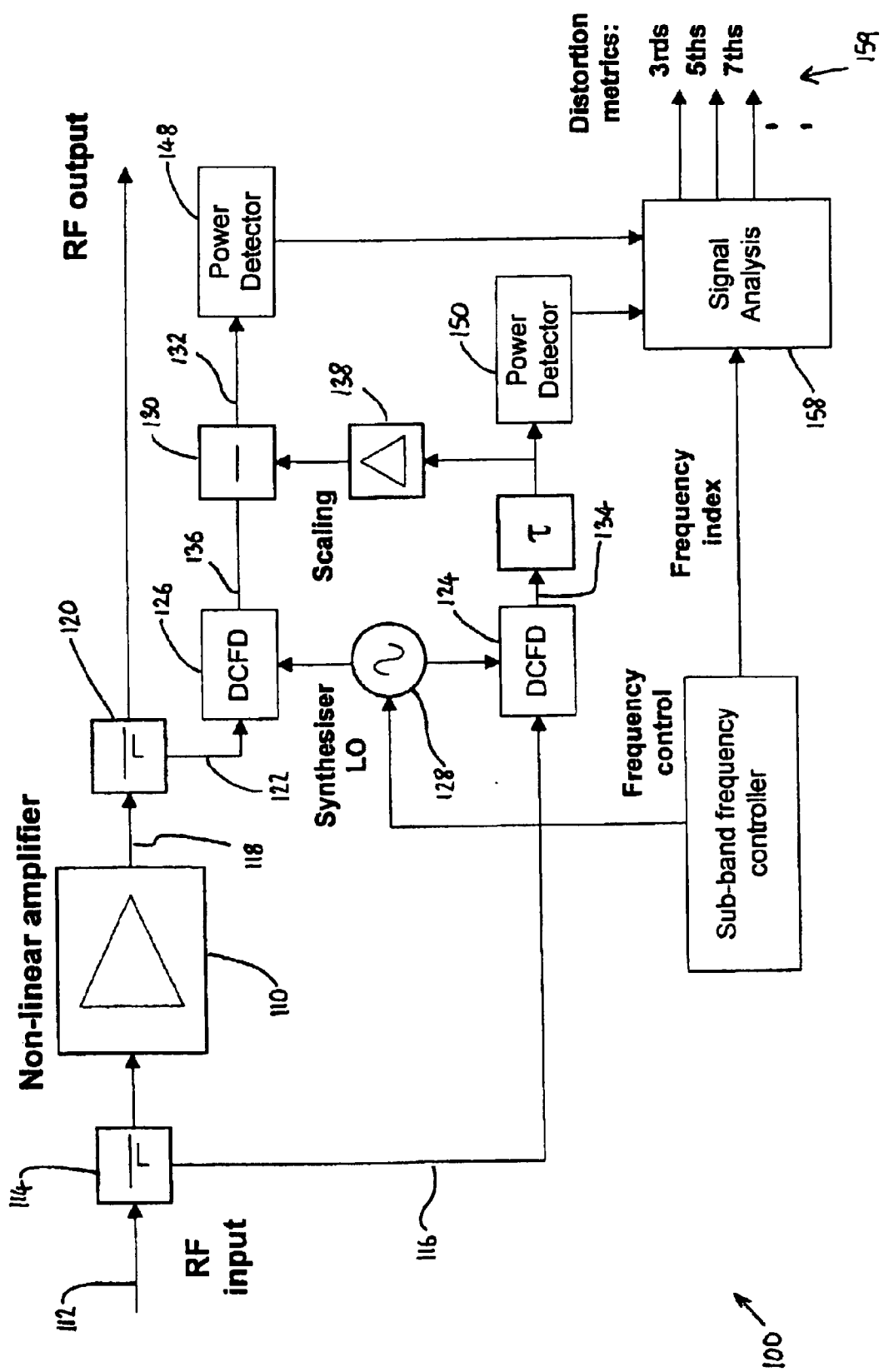
FIGS. 1 and 2 each schematically illustrate distortion detecting apparatus applied to a non-linear amplifier.

Distortion detection scheme 100 in FIG. 1 operates on non-linear amplifier 110. Amplifier 110 is a wide band radio frequency power amplifier having a non-linear characteristic such that it imposes intermodulation distortion upon signals passing through it. The distortion detection scheme 100 provides signals indicative of this distortion which can be used by an appropriate distortion reduction mechanism (not shown), for example, a predistorter operating on the input 112 to amplifier 110, subsequent to coupler 114.

The input signal 112 is sampled at coupler 114 along path 116. The output 118 of the amplifier 110 is sampled at coupler 120 along path 122. The signals on paths 116 and 122 are frequency down-converted and filtered by Down Conversion, Filtering and Digitisation (DCFD) units 124 and 126 respectively. The downconversion performed by units 124 and 126 is performed by mixing the incoming signal with a local oscillator (LO) signal from frequency controlled synthesiser 128. The digital output of DCFD 126 therefore corresponds to a coincident sample of a sub-band of output signal 118. Similarly, the digital output of DCFD 124 corresponds to a sample of the same sub-band of input signal 112.

It will be appreciated that DCFD units 124 and 126 can be adjusted to pass a different sub-band from the input signal 112 and the amplifier output signal 118 respectively. This can be achieved by adjusting the frequency of the LO signal from synthesiser 128 so that different frequency ranges are mixed down to the filter passbands within DCFD units 124 and 126. Hence, the frequency band of the input and output signals can be divided into a number of sub-bands which can be evaluated in turn by adjusting the frequency of the output of synthesiser 128. The desired sub-bands could be overlapping or abutting so as to cover the whole frequency band of interest but, on the other hand, it might be that they do not cover the whole of the frequency band of the input and output signals in a contiguous fashion. It is possible for the desired sub-bands to be assigned dynamically by, for example, detecting only those sub-bands corresponding to portions of the frequency band of the input and output signals which contain signal energy at a particular time.

Since it is the distortion present in signal 118 which is of interest, the detection scheme 100 forms a signal indicative of this distortion. This is achieved by using subtractor 130 to produce a residual signal 132. Subtractor 130 subtracts the input signal sub-band 134 provided by DCFD 124 from the output signal sub-band 136 provided by DCFD unit 126. This subtraction process cancels components in sub-band 136 which correspond to actual components of the input signal 112 to amplifier 110. The residual signal 132 therefore contains substantially only components of sub-band 136 which correspond to distortion present in the output 118 of amplifier 110. To ensure the cancellation of components of input signal 112 in sub-band 136, sub-band 134 is scaled by scaler 138 which matches the amplitude of components due to input signal 112 in the two sub-band signals 134 and 136 (the signal 118 being an amplified version of signal 112).

The power of the residual signal 132 is then measured using a power detector 148 to determine the amount of distortion in the output 118 of amplifier 110 within a given sub-band. A complete picture of distortion contained in the amplifier output 118 can then be acquired by stepping through the sub-bands by changing the frequency of the LO signal produced by synthesiser 128. Power detector 150 measures the power present within a given sub-band of the input signal 112.

The pattern of distortion energies measured in the various sub-bands across the frequency band of interest and the corresponding pattern of input signal energies are then acquired by the signal analyser 158. The signal analyser 158 can determine the amount of third-order and other orders of distortion present in the amplifier output signal 118 based upon the acquired data. The signal analyser's measurements 159 of third-order and higher order distortion components can then be used to control an amplifier linearisation mechanism, for example, a predistorter or a feed-forward linearisation system.

Figure 2:
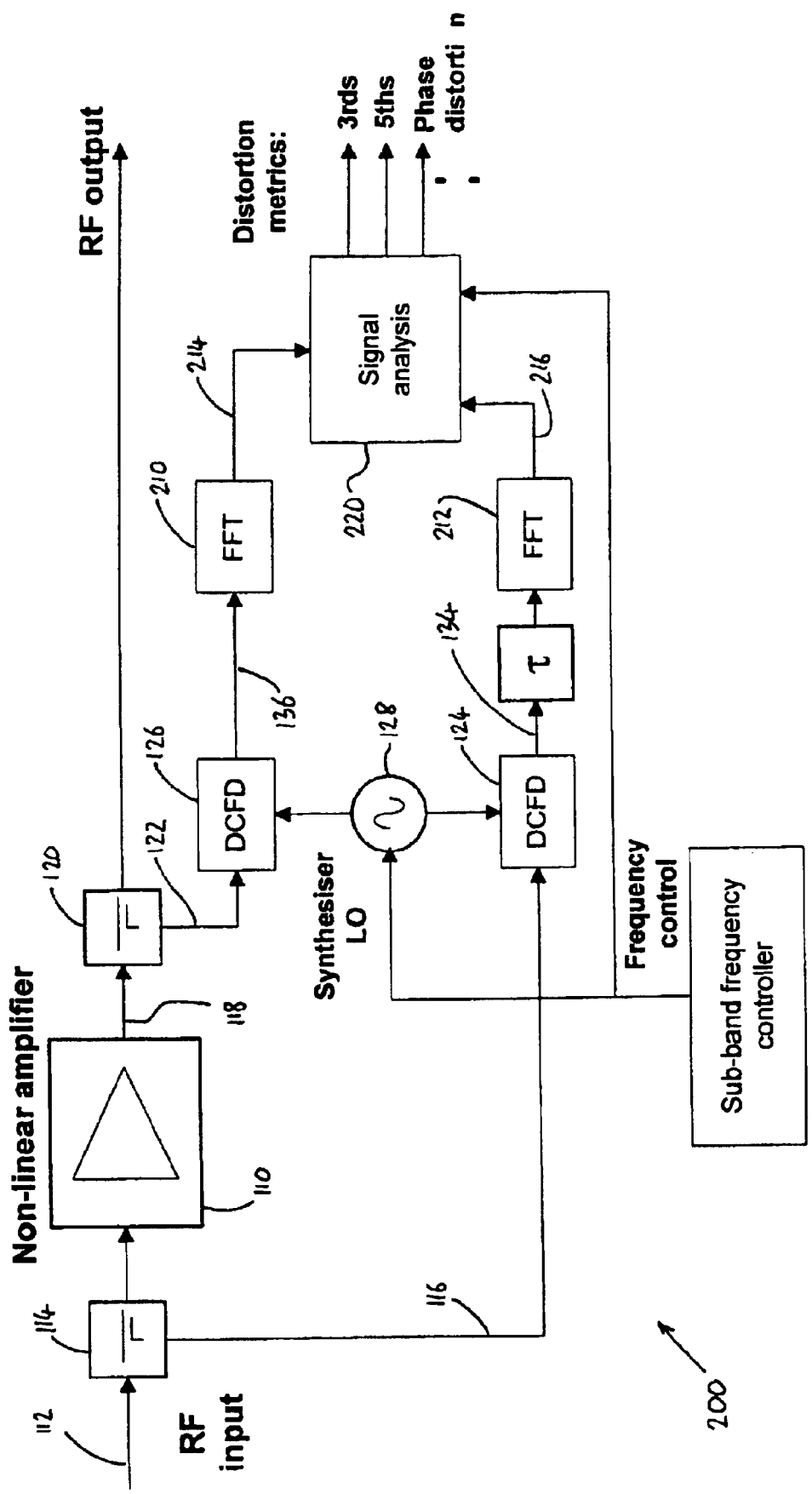

It will be appreciated that many of the signal processing functions illustrated in the block diagrams of FIG. 1 and FIG. 2, including parts of the DCFD units and the synthesiser, can be implemented digitally as well as by using analogue techniques. It will also be appreciated that the invention apparatus is particularly suited to integration, since breaking the frequency band of interest into narrower sub-bands allows the use of integrated analogue to digital converters and digital signal processing techniques.

The distortion detection scheme 200 shown in FIG. 2 is more sophisticated than scheme 100 and can advantageously use similar hardware as was used in scheme 100, (and therefore keep costs substantially the same) but it can exploit more powerful signal processing techniques to analyse the distortion products contained in the amplifier output 118. The distortion detection scheme 200 of FIG. 2 is similar in many ways to detection scheme 100. Therefore, elements of detection scheme 200 already described with reference to detection scheme 100 retain the same reference numerals and will not be described again in detail in the following discussion.

In detection scheme 200, the output signal sub-band 136 and the input signal sub-band 134 are each translated from the time domain to the frequency domain by, for example, a digital Fourier transformation process, indicated by FFT units 210 and 212. The spectra 214 and 216 for a given sub-band are acquired by a signal analyser 220. The signal analyser 220 records the nature of the input spectrum based upon the spectrum 216. A vector subtraction step within the signal analyser 220 performs prescaling and vector difference operations similar to the scaling operations involving scaler 138 and subtractor 130 in FIG. 1. The input power and distortion vector error data in each sub-band can be used by the signal analysers 220 to distinguish and quantify distortion errors arising from different orders of intermodulation distortion and phase distortion in the amplifier 110.

Based upon the pattern of distortion error vectors in each sub-band, the signal analyser 220 can determine which order of amplifier non-linearity, for example, third order, fifth order, etc., is responsible for a given measured distortion product. Consider, for example, an amplifier amplifying multiple modulated carriers. To distinguish and quantify the amount of third order distortion present in the amplifier output signal 118, the signal analyser 220 first examines the spectrum of the input signal 216 in each sub-band to determine the frequencies and powers of the incoming carrier or carriers. Using this information, the signal analyser 220 computes a set of sub-bands and frequencies where it expects to find significant third order distortion products. The signal analyser 220 then examines the sub-bands and frequencies in the distortion vector error data where it expects to find third order distortion products. The signal analyser 220 then collects the amounts of third order distortion energy found in the expected sub-bards and frequencies to quantify the third order distortion present in the amplifier output signal 118. This measure of third order distortion is then output from the signal analyser 220 and can be used to control an external amplifier linearisation means. Similarly, the signal analyser 220 can determine where it expects to find fifth order, etc., distortion due to the amplifier input signal 112.

It will be appreciated that scheme 200 can be used to build up a spectrum of the residual distortion across the entire frequency band of input signal 112 by calculating the residual distortion spectra at different sub-bands by varying the frequency of local oscillator signal produced by synthesiser 128. As with detection scheme 100, in detection scheme 200, the series of sub-bands dictated by local oscillator signal 128 may be overlapping, abutting or providing coverage of only parts of the frequency band of input signal 112. It may be desirable to move through the series of sub-bands in a sequence which is pseudo random. In this way, each sub-band is processed at a pseudo randomised time. This avoids any interactive effects between the sequence of sub-bands sampled and the temporal characteristics of the input signal 112. In general, it is also possible for the sub-bands to be of unequal or adjustable frequency width to allow different parts of the frequency band of the input signal 112 to be covered with differing resolutions. This may assist the optimisation of distortion suppression and convergence speed (of a distortion reduction mechanism) for certain regions of the frequency band of the input signal 112 where linearisation is considered more important.

The detection schemes described herein may also be rendered adaptive by, for example, arranging that the sub-band bandwidths and/or sub-band sequences adapt to the occupancy of the frequency band of the input signal 112. An adaptive bandwidth scheme is facilitated by digital implementations of the filtering operations within the DCFD functions. This allows the filtering operations to have an adjustable bandwidth. The resolutions and integration intervals of the FFT operations can also be adjusted to adapt the frequency resolution within a sub-band or to vary the data collection time at each sub-band frequency.

An adaptive distortion detection scheme would advantageously allow a distortion suppression mechanism to achieve better distortion suppression and convergence speed. Adaption would allow distortion detection sensitivity and performance to be concentrated exactly where it is needed within the frequency band of the input signal 112. Thus, enhanced distortion suppression performance would be obtained over the portions of the frequency band which are of interest at the expense of other parts of the frequency band where distortion suppression is not required (perhaps because the latter parts of the frequency band are not in use at a given time). Normally, it is observed that a linearised amplifier provides variable linearity across the band of interest. The above described adaptive techniques offer a way of steering the frequencies where better linearity can be obtained from the combination of the non-linear amplifier and the distortion suppression mechanism to match the frequencies occupied in input signal 112 at any one time. Therefore, the distortion suppression can be optimised to have the most effect at the frequencies of the strongest signals where it is most needed.

In a variation of detection schemes 100 and 200, the phase and amplitude, or inphase and quadrature (IQ) elements of the downconverted sub-band signals 134 and 136 can be detected and used to control both amplitude and phase (or both I and Q parts) of, for example, a phase and amplitude predistorter.

What is claimed is:

1. Apparatus for detecting distortion in an output signal which signal handling equipment produces in response to an input signal, the apparatus comprising:
   an isolator adapted to isolate an input frequency sub-band of the input signal and an output frequency sub-band of the output signal;
   a comparator adapted to compare a measure of the input frequency sub-band to a measure of the output frequency sub-band to assess the output signal for distortion; and
   a controller adapted to change the frequency of the input frequency sub-band and the frequency of the output frequency sub-band to assess the distortion in the output signal at a plurality of different frequency sub-bands.

2. The invention of claim 1, wherein the isolator comprises:
   a synthesizer adapted to generate a local oscillator (LO) signal;
   an input down conversion, filtering, and digitization (DCFD) unit adapted to isolate the input frequency sub-band of the input signal based on the LO signal; and
   an output DCFD unit adapted to isolate the output frequency sub-band of the output signal based on the LO signal, wherein:
      the controller is adapted to control frequency of the LO signal to change the frequency of the input frequency sub-band and the frequency of the output frequency sub-band.

3. The invention of claim 2, wherein the controller is adapted to control the frequency of the LO signal in a sequence which is not in frequency order in order to isolate the frequency sub-bands in a discontinuous manner.

4. The invention of claim 3, wherein the controller is adapted such that the frequency sub-bands are isolated in a pseudo-random manner.

5. The invention of claim 3, wherein the controller is adapted such that the frequency sub-bands are isolated in an adaptive manner.

6. The invention of claim 5, wherein the adaptive manner concentrates on frequency sub-bands having stronger input signals.

7. The invention of claim 1, wherein the measures of the input and output frequency sub-bands are powers of the sub-bands.

8. The invention of claim 1, wherein:
   the isolator is adapted to transform the input and output frequency sub-bands into a frequency domain; and
   the measures of the input and output frequency sub-bands are based on frequency spectra of the sub-bands in the frequency domain.

9. The invention of claim 8, wherein the comparator is adapted to perform vector subtraction on the input and output frequency spectra to assess the distortion in the output signal.

10. The invention of claim 1, wherein the comparator is adapted to correlate (i) a residual signal generated from the measures of the input and output frequency sub-bands with (ii) a reference distortion signal.

11. The invention of claim 10, wherein the reference distortion signal is derived by multiplying the input frequency sub-band by itself repeatedly.

12. The invention of claim 1, wherein the distortion is one or both of phase distortion and amplitude distortion.

13. The invention of claim 1, wherein at least two frequency sub-bands have different frequency widths.

14. A method for detecting distortion in an output signal which signal handling equipment produces in response to an input signal, the method comprising:
   isolating an input frequency sub-band of the input signal and an output frequency sub-band of the output signal;
   comparing a measure of the input frequency sub-band to a measure of the output frequency sub-band to assess the output signal for distortion; and
   changing the frequency of the input frequency sub-band and the frequency of the output frequency sub-band to assess the distortion in the output signal at a plurality of different frequency sub-bands.

15. The invention of claim 14, wherein isolating the frequency sub-bands comprises:

generating a local oscillator (LO) signal;

isolating the input frequency sub-band of the input signal based on the LO signal; and isolating the output frequency sub-band of the output signal based on the LO signal, wherein:

the frequency of the LO signal is controlled to change frequency of the input frequency sub-band and the frequency of the output frequency sub-band.

16. The invention of claim 15, wherein the frequency of the LO signal is controlled in a sequence which is not in frequency order in order to isolate the frequency sub-bands in a discontinuous manner.

17. The invention of claim 16, wherein the frequency sub-bands are isolated in a pseudo-random manner.

18. The invention of claim 16, wherein the frequency sub-bands are isolated in an adaptive manner.

19. The invention of claim 18, wherein the adaptive manner concentrates on frequency sub-bands having stronger input signals.

20. The invention of claim 14, wherein the measures of the input and output frequency sub-bands are powers of the sub-bands.

21. The invention of claim 14, wherein:

isolating the frequency sub-bands comprises transforming the input and output frequency sub-bands into a frequency domain; and the measures of the input and output frequency sub-bands are based on frequency spectra of the sub-bands in the frequency domain.

22. The invention of claim 21, wherein vector subtraction is performed on the input and output frequency spectra to assess the distortion in the output signal.

23. The invention of claim 14, wherein a residual signal generated from the measures of the input and output frequency sub-bands is correlated with a reference distortion signal.

24. The invention of claim 23, wherein the reference distortion signal is derived by multiplying the input frequency sub-band by itself repeatedly.

25. The invention of claim 14, wherein the distortion is one or both of phase distortion and amplitude distortion.

26. The invention of claim 14, wherein at least two frequency sub-bands have different frequency widths.

* * * * *